United States Patent
Ishihara et al.

(10) Patent No.: US 8,994,041 B2
(45) Date of Patent: Mar. 31, 2015

(54) PHOTODIODE ARRAY MODULE AND MANUFACTURING METHOD FOR SAME

(75) Inventors: Masatoshi Ishihara, Hamamatsu (JP); Nao Inoue, Hamamatsu (JP); Hirokazu Yamamoto, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 1 day.

(21) Appl. No.: 14/006,506

(22) PCT Filed: Mar. 27, 2012

(86) PCT No.: PCT/JP2012/057994
§ 371 (c)(1),
(2), (4) Date: Sep. 20, 2013

(87) PCT Pub. No.: WO2012/133448
PCT Pub. Date: Oct. 4, 2012

(65) Prior Publication Data
US 2014/0021575 A1    Jan. 23, 2014

(30) Foreign Application Priority Data
Mar. 31, 2011  (JP) ................. 2011-079300

(51) Int. Cl.
*H01L 29/18* (2006.01)
*H01L 33/00* (2010.01)
*H01L 27/146* (2006.01)
*H01L 25/16* (2006.01)
*H04N 1/03* (2006.01)

(52) U.S. Cl.
CPC ........ *H01L 27/14645* (2013.01); *H01L 25/167* (2013.01); *H01L 27/14634* (2013.01); *H04N 1/03* (2013.01); *H01L 27/14694* (2013.01)
USPC .............................. 257/88; 257/431; 257/443

(58) Field of Classification Search
CPC .............. H01L 27/14634; H01L 27/14694; H01L 27/14645; H01L 27/14643; H01L 25/167
USPC .............................. 257/79, 88, 431, 440, 443
See application file for complete search history.

(56) References Cited

U.S. PATENT DOCUMENTS

| | | |
|---|---|---|
| 6,104,046 A | 8/2000 | Borenstain |
| 2004/0104351 A1* | 6/2004 | Shibayama .............. 250/370.11 |
| 2005/0194654 A1* | 9/2005 | Iguchi ......................... 257/458 |

FOREIGN PATENT DOCUMENTS

| | | |
|---|---|---|
| JP | 06-067114 A | 3/1994 |
| JP | 9-304182 A | 11/1997 |
| JP | 2001-345999 A | 12/2001 |

(Continued)

*Primary Examiner* — Colleen A Matthews
*Assistant Examiner* — Quovaunda V Jefferson
(74) *Attorney, Agent, or Firm* — Drinker Biddle & Reath LLP

(57) ABSTRACT

This photodiode array module includes a first semiconductor substrate 2 having a first photodiode array that is sensitive to light of a first wavelength band, a second semiconductor substrate 2' having a second photodiode array that is sensitive to light of a second wavelength band, and a third semiconductor substrate 3 which is formed with a plurality of amplifiers AMP and on which the first and second semiconductor substrates 2, 2' are placed side by side without overlapping, and which connects each photodiode to the amplifier AMP via a bump. In adjacent end portions of the first semiconductor substrate 2 and the second semiconductor substrate 2', stepped portions are formed, which thus allows performing measurement with low noise even when respective pixels are aligned successively over both substrates.

3 Claims, 15 Drawing Sheets

(56) References Cited

FOREIGN PATENT DOCUMENTS

| JP | 2002-033505 | | 1/2002 |
|---|---|---|---|
| JP | 2004-119602 | A | 4/2004 |
| JP | 2007-184355 | A | 7/2007 |
| WO | WO 00/02258 | | 1/2000 |
| WO | WO-00/62344 | A1 | 10/2000 |
| WO | WO 2006/129762 | | 12/2006 |

* cited by examiner

Fig.9
(A)
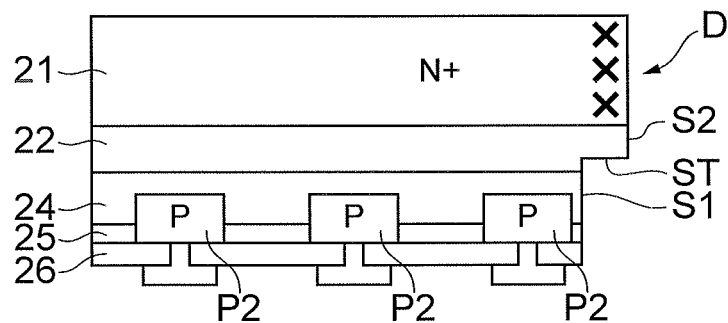
(B)
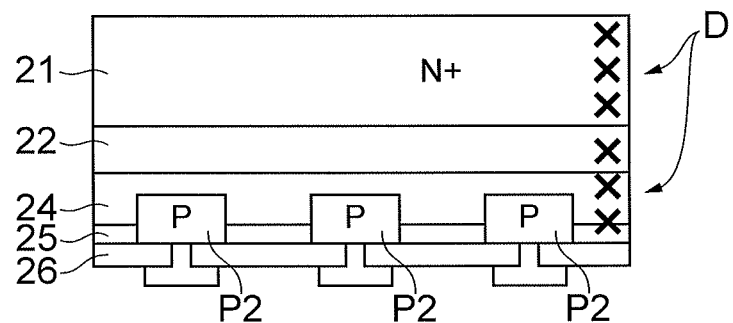
(C)
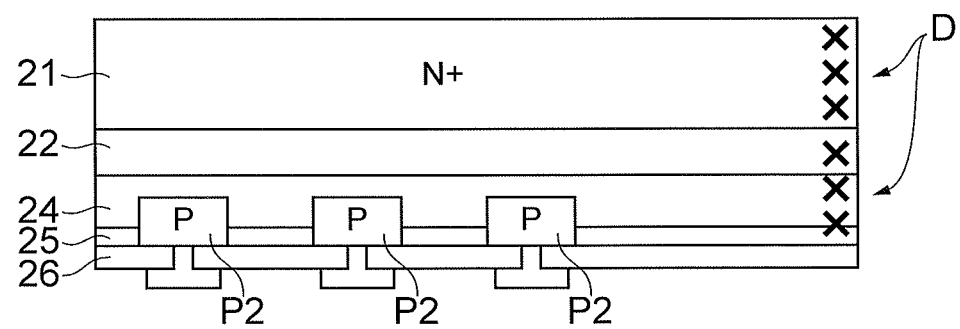

Fig.10
(A)
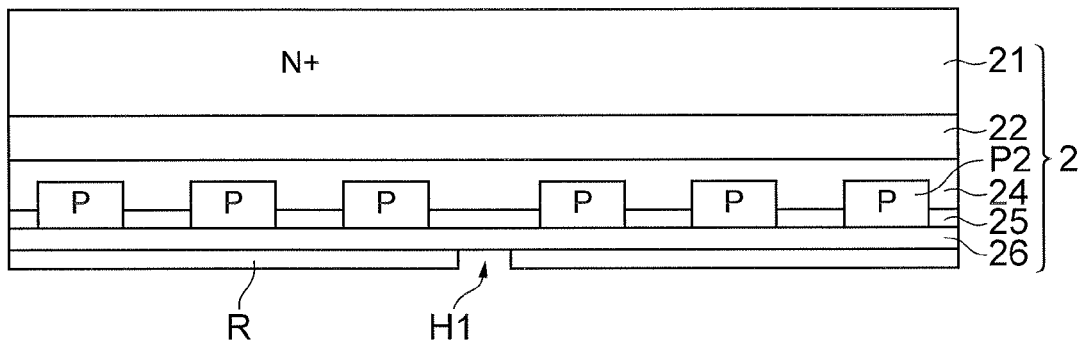
(B)
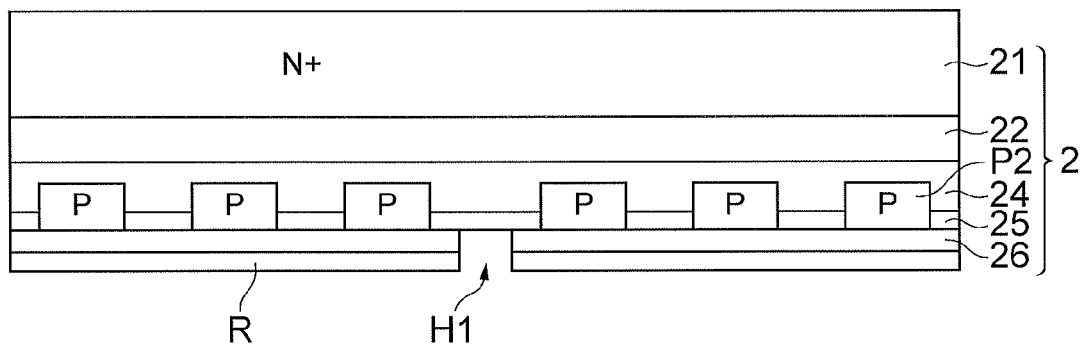
(C)
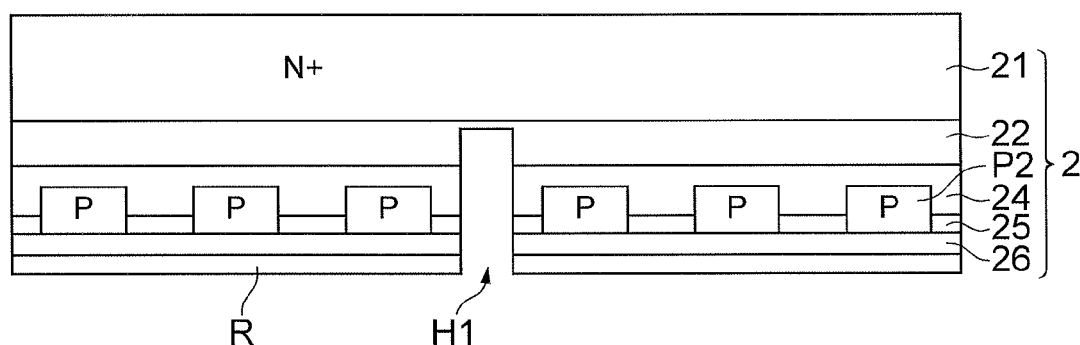
(D)
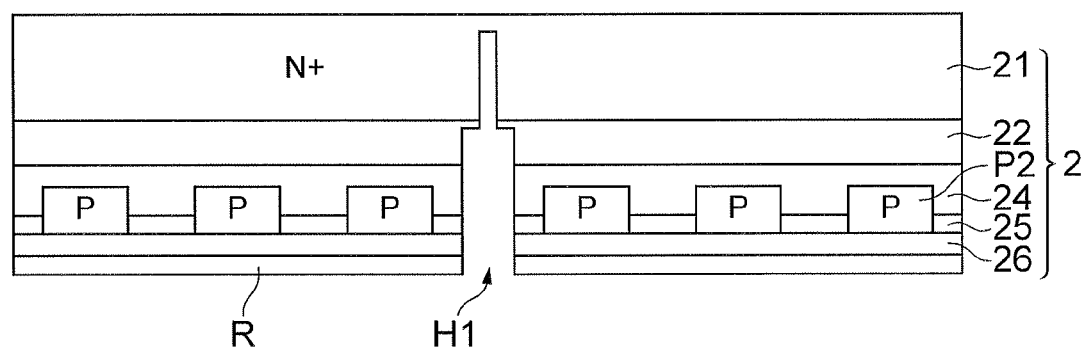

PHOTODIODE ARRAY MODULE AND MANUFACTURING METHOD FOR SAME

TECHNICAL FIELD

The present invention relates to a photodiode array module and a method of manufacturing the same.

BACKGROUND ART

Patent Document 1 discloses a structure in which a CCD (a charge-coupled device) is disposed at a previous stage position where a light to be measured is incident, and an InGaAs photodiode array is disposed at a subsequent stage position of the CCD, these are connected via bumps, and output signals from respective channels of the InGaAs photodiode array are read out by a shift register formed on the CCD.

Patent Document 2 discloses a structure where two HgCdTe photodiode arrays with a single sensor of which a long sensor is difficult to prepare are disposed successively. In this structure, the two photodiode arrays are disposed to be overlapped in part in order to prevent the pixel pitch from changing at a boundary between the photodiode arrays, but images in a plurality of wavelength bands cannot be detected.

Patent Document 3 discloses a structure in which a Si-CCD is disposed at a previous stage position where a light to be measured is incident and an InGaAs image sensor is disposed at a subsequent stage position of the CCD, and outputs are respectively separately taken out to the outside. In the case of this structure, images in a plurality of wavelength bands can be detected, but it is difficult to provide a module that is long in dimension.

CITATION LIST

Patent Literature

Patent Document 1: Pamphlet of International Publication No. WO00/62344
Patent Document 2: Japanese Patent Application Laid-Open No. H06-67114
Patent Document 3: Japanese Patent Application Laid-Open No. H09-304182

SUMMARY OF INVENTION

Technical Problem

Therefore, a structure is considered in which a Si-CCD and an InGaAs image sensor are disposed side by side horizontally, but in this case, it is difficult to make pixels of both image sensors successive also at a boundary between these image sensors. This is because it is necessary, in end portions of both image sensors, to secure a margin to suppress the influence of damage to the image sensor during dicing. Of course, it is also considered to be possible to eliminate such a problem by overlapping in part as in the structure described in Patent Document 2, but in actuality, stress is generated in the overlapping part to cause breakage, an incident image is different in focusing position by the thickness of the overlap, so that a problem occurs that a precise measurement cannot be performed.

Accordingly, it is not considered to be suitable for performing a precise measurement to construct a photodiode array module in which pixels are successively arrayed by horizontally disposing two image sensors having different wavelength bands.

The present invention has been made in view of such a problem, and an object thereof is to provide a photodiode array module capable of a precise measurement.

Solution to Problem

In order to solve the foregoing problem, a photodiode array module according to an aspect of the present invention is a photodiode array module including a first semiconductor substrate having a first photodiode array that is sensitive to light of a first wavelength band, a second semiconductor substrate having a second photodiode array that is sensitive to light of a second wavelength band, and a third semiconductor substrate which is formed with a plurality of amplifiers and on which the first and second semiconductor substrates are placed side by side without overlapping, and is characterized in that the third semiconductor substrate has wirings respectively connected to the amplifiers, each of the wirings is electrically connected to each photodiode of the first and second photodiode arrays via a bump, in the first photodiode array, an end portion adjacent to the second photodiode array has a first stepped portion, the first stepped portion has a first side surface and a second side surface along a thickness direction of the first semiconductor substrate, and a first terrace surface located at a boundary between the first side surface and the second side surface and opposed to the third semiconductor substrate, the first side surface is closer to the third semiconductor substrate than the second side surface, a crystal defect density in the first side surface is lower than a crystal defect density in the second side surface, in the second photodiode array, an end portion adjacent to the first photodiode array has a second stepped portion, the second stepped portion has a third side surface and a fourth side surface along a thickness direction of the second semiconductor substrate, and a second terrace surface located at a boundary between the third side surface and the fourth side surface and opposed to the third semiconductor substrate, the third side surface is closer to the third semiconductor substrate than the fourth side surface, and a crystal defect density in the third side surface is lower than a crystal defect density in the fourth side surface.

According to the photodiode array module of the aspect of the present invention, because the crystal defect density of the first side surface of the first stepped portion is low, photodiodes can be brought close thereto, and because the crystal defect density of the third side surface of the second stepped portion is low, photodiodes can be brought close thereto. Accordingly, it becomes possible to place the first semiconductor substrate and the second semiconductor substrate horizontally without overlapping each other so as to array the photodiodes (pixels) of both successively. Moreover, because the first and second semiconductor substrates are not overlapping, generation of stress in an overlapping part can be suppressed and a focusing position of an incident light with respect to the first and second semiconductor substrates can also be set to the same position, so that a precise measurement is enabled.

Moreover, the photodiode array module according to the aspect of the present invention is characterized in that each of the photodiodes composing the first photodiode array includes a first semiconductor region of a first conductivity type, and a first pixel region of a second conductivity type located at a surface layer side of a surface of the first semiconductor substrate opposed to the third semiconductor substrate, a depth of the first terrace surface from an opposing surface of the first semiconductor substrate to the third semiconductor substrate is deeper than a depth of the first pixel region of the first photodiode array, each of the photodiodes composing the second photodiode array includes a second semiconductor region of a first conductivity type, and a second pixel region of a second conductivity type located at a surface layer side of a surface of the second semiconductor substrate opposed to the third semiconductor substrate, and a depth of the second terrace surface from an opposing surface of the second semiconductor substrate to the third semiconductor substrate is deeper than a depth of the second pixel region of the second photodiode array.

In this case, because the first side surface and the third side surface extend up to positions deeper than the pixel regions, the influence on the first and second pixel regions from the second side surface and the fourth side surface that exist at further deeper positions than those of the first and third side surfaces can be suppressed.

Moreover, a method of manufacturing the foregoing photodiode array module is characterized by including a step of preparing a first wafer including the first semiconductor substrate having the first photodiode array, a step of etching the first wafer along a first etching line to expose the first side surface, a step of dicing the first wafer along a deepest portion of the first etching line to expose the second side surface, a step of preparing a second wafer including the second semiconductor substrate having the second photodiode array, a step of etching the second wafer along a second etching line to expose the third side surface, a step of dicing the second wafer along a deepest portion of the second etching line to expose the fourth side surface, and a step of adhering the first semiconductor substrate and second semiconductor substrate to the third semiconductor substrate via the bumps, and electrically connecting each photodiode in the first semiconductor substrate and second semiconductor substrate to each of the amplifiers via the bump.

In this case, the crystal defect density in the first side surface and the third side surface that are formed by etching is lower than the crystal defect density of the second side surface and the fourth side surface that are formed when dicing is performed. Accordingly, the influence on the first and second pixel regions from the second side surface and the fourth side surface can be suppressed, which enables a precise measurement.

Advantageous Effects of Invention

According to the photodiode array module of the aspect of the present invention, it becomes possible to perform a precise measurement over different wavelength bands.

BRIEF DESCRIPTION OF DRAWINGS

FIG. 9 includes views for explaining the effect of a stepped portion.
FIG. 10 includes views for explaining a method of manufacturing a semiconductor substrate.

DESCRIPTION OF EMBODIMENTS

Hereinafter, a photodiode array module and a method of manufacturing the same according to an embodiment will be described. Also, the same components will be denoted by the same reference signs, and overlapping description will be omitted.

Figure 1:
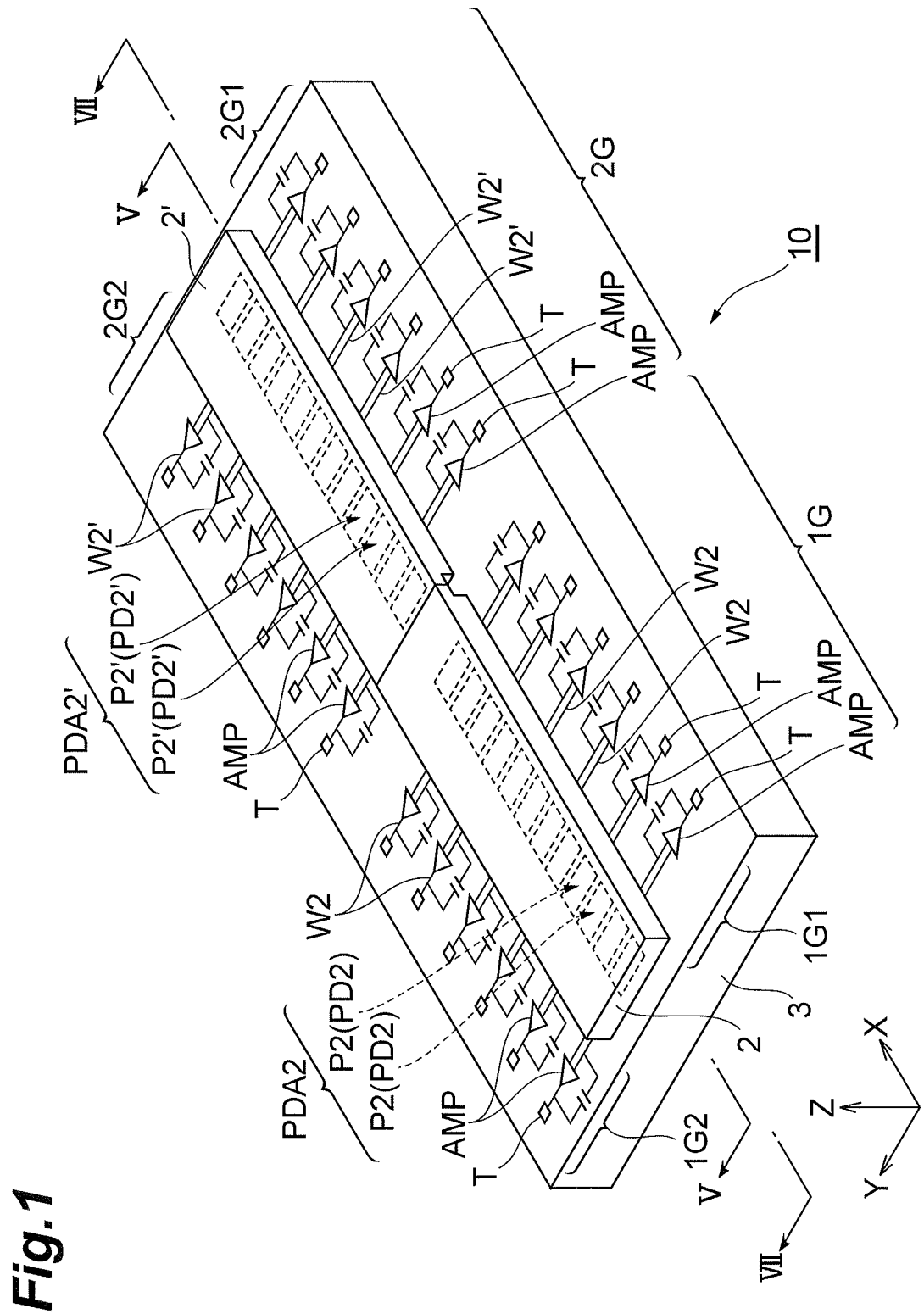
FIG. 1 is a perspective view of a photodiode array module.

FIG. 1 is a perspective view of the photodiode array module according to the embodiment.

This photodiode array module 10 includes a first semiconductor substrate 2 of a composition A made of a compound semiconductor material (InGaAs) and a second semiconductor substrate 2' of a composition B made of a compound semiconductor material (InGaAs). Both semiconductor substrates 2, 2' are placed on a third semiconductor substrate 3 and fixed. The first semiconductor substrate 2 has a first photodiode array PDA2, and the second semiconductor substrate 2' has a second photodiode array PDA2'. These semiconductor substrates 2, 2' are the same in structure except for their compositions.

The composition A of the first semiconductor substrate 2 is sensitive to light of, for example, a first wavelength band (900 nm to 1700 nm), the composition B of the second semiconductor substrate 2' is sensitive to light of a second wavelength band (900 nm to 2600 nm), and the wavelength bands for these are different. Also, the third semiconductor substrate 3 is made of Si.

To a front surface of the third semiconductor substrate 3, front surfaces of the first semiconductor substrate 2 and the second semiconductor substrate 2' are adhered. On the third semiconductor substrate 3, a plurality of amplifiers AMP to which outputs from respective photodiodes are input are formed. These amplifiers are formed using an ordinary device forming method.

A three-dimensional rectangular coordinate system is set whose Z-axis is in a thickness direction of the third semiconductor substrate 3, whose X-axis is in an array direction of photodiodes, and whose Y-axis is in a direction perpendicular to both of the Z-axis and X-axis. The X-axis corresponds to the longitudinal direction of the semiconductor substrates 2, 2', 3 and the Y-axis corresponds to the width direction of the semiconductor substrates 2, 2', 3. A light to be made incident on the photodiode array module 10 proceeds in a −Z-direction. That is, light is incident on the module 10 from the side of the first semiconductor substrate 2 and the second semiconductor substrate 2'. The light is incident from a back surface side of the first semiconductor substrate 2 and the second semiconductor substrate 2', photoelectric conversion is performed in photosensitive regions located at their front surface side, and outputs are taken out via bumps and wiring groups. The outputs are taken out to the outside via bumps, wiring groups, and amplifiers AMP provided on the third semiconductor substrate 3.

The first photodiode array PDA2 and the second photodiode array PDA2' are located at the side of surfaces opposed to the third semiconductor substrate 3 in the respective semiconductor substrates 2 and 2'.

All amplifiers AMP are formed within the third semiconductor substrate 3, but these amplifiers AMP will be divided into several groups and defined.

A first group 1G of a plurality of amplifiers AMP is a group electrically connected to the first photodiode array PDA2. That is, the first group 1G of amplifiers AMP are, via a first wiring group W2 provided by patterning on the third semiconductor substrate 3 and bumps B respectively provided on the first wiring group W2, respectively electrically connected to the respective photodiodes of the first photodiode array PDA2.

A pair of common wirings CW2(1) and CW2(2) (refer to FIG. 3) formed via an insulating layer on the front surface of the first semiconductor substrate 2 extend along the X-axis, and construct one-side electrodes (cathodes) of photodiodes PD2, and pixel regions P2 construct the other-side electrodes (anodes). These cathodes and anodes are connected with the first wiring group W2, and are respectively connected to the non-inverting input terminals (+) and inverting input terminals (−) of the amplifiers AMP on a photodiode-by-photodiode basis (refer to FIG. 2).

Similarly, a second group 2G of a plurality of amplifiers AMP is a group electrically connected to the second photodiode array PDA2'. The second group 2G of amplifiers AMP are, via a second wiring group W2' provided by patterning on the third semiconductor substrate 3 and bumps respectively provided on the second wiring group W2', respectively electrically connected to the respective photodiodes of the second photodiode array PDA2'.

A pair of common wirings CW2'(1) and CW2'(2) (refer to FIG. 4) formed via an insulating layer on the front surface of the second semiconductor substrate 2' extend along the X-axis, and construct one-side electrodes (cathodes) of photodiodes PD2', and pixel regions P2' construct the other-side electrodes (anodes). These cathodes and anodes are connected with the second wiring group W2', and are respectively connected to the non-inverting input terminals (+) and inverting input terminals (−) of the amplifiers AMP on a photodiode-by-photodiode basis (refer to FIG. 2).

Figure 2:
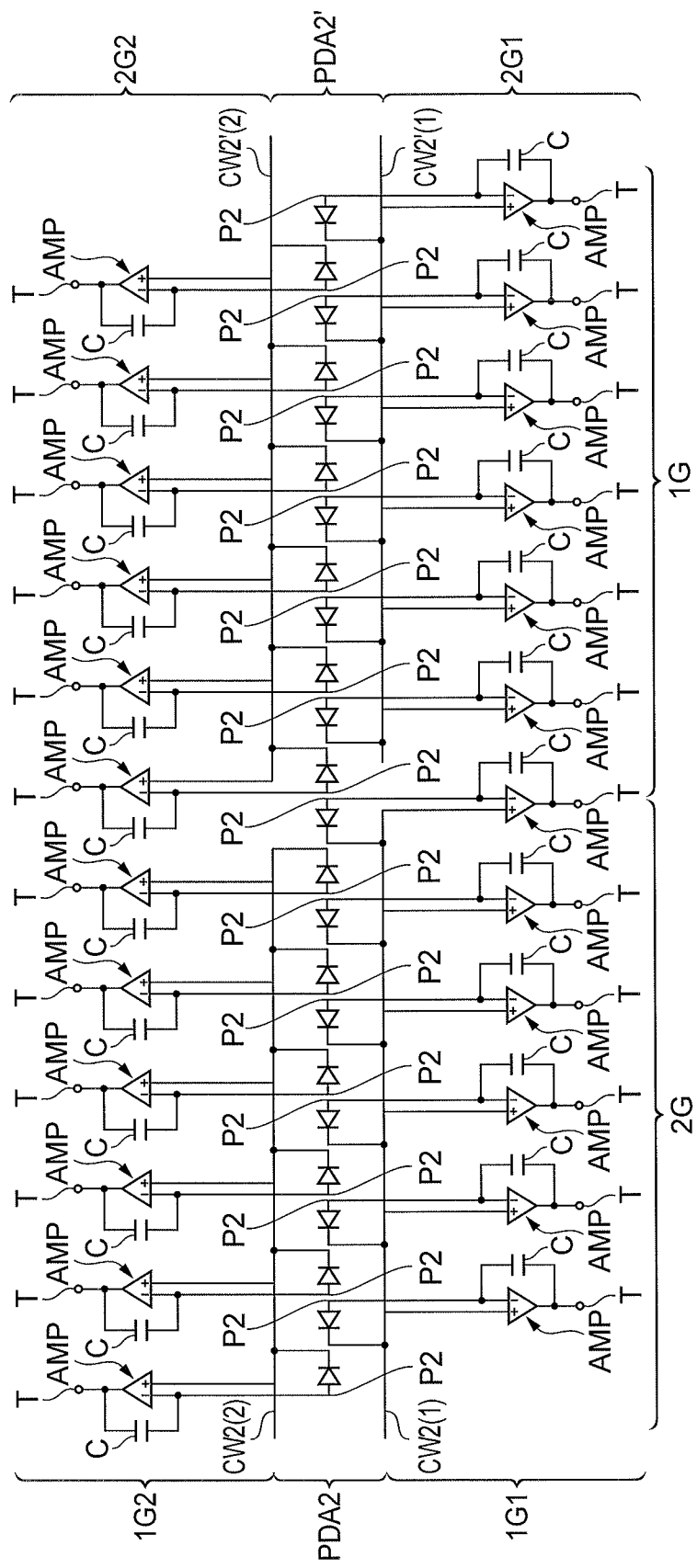
FIG. 2 is a circuit diagram of the photodiode array module.

FIG. 2 is a circuit diagram of the photodiode array module.

Referring to FIG. 1 and FIG. 2, the amplifiers AMP are located on both sides of the photodiode arrays PDA2, PDA2'. The array direction of the amplifiers AMP is parallel to the X-axis, and both groups 1G, 2G are coincident in the array direction of the amplifiers AMP. The respective photodiodes PD2, PD2' are arrayed along the X-direction, and located on the same line. With reference to the array direction of the photodiodes PD2, PD2', amplifier groups located on one side are provided as 1G1, 2G1, and amplifier groups located on the other side are provided as 1G2, 2G2. Because the photodiode arrays are formed on the substrates different from the substrate on which the amplifiers are formed, the amplifiers do not need to be disposed on both sides of the photodiode arrays, and it suffices that the amplifiers are divided into two groups.

Figure 3:
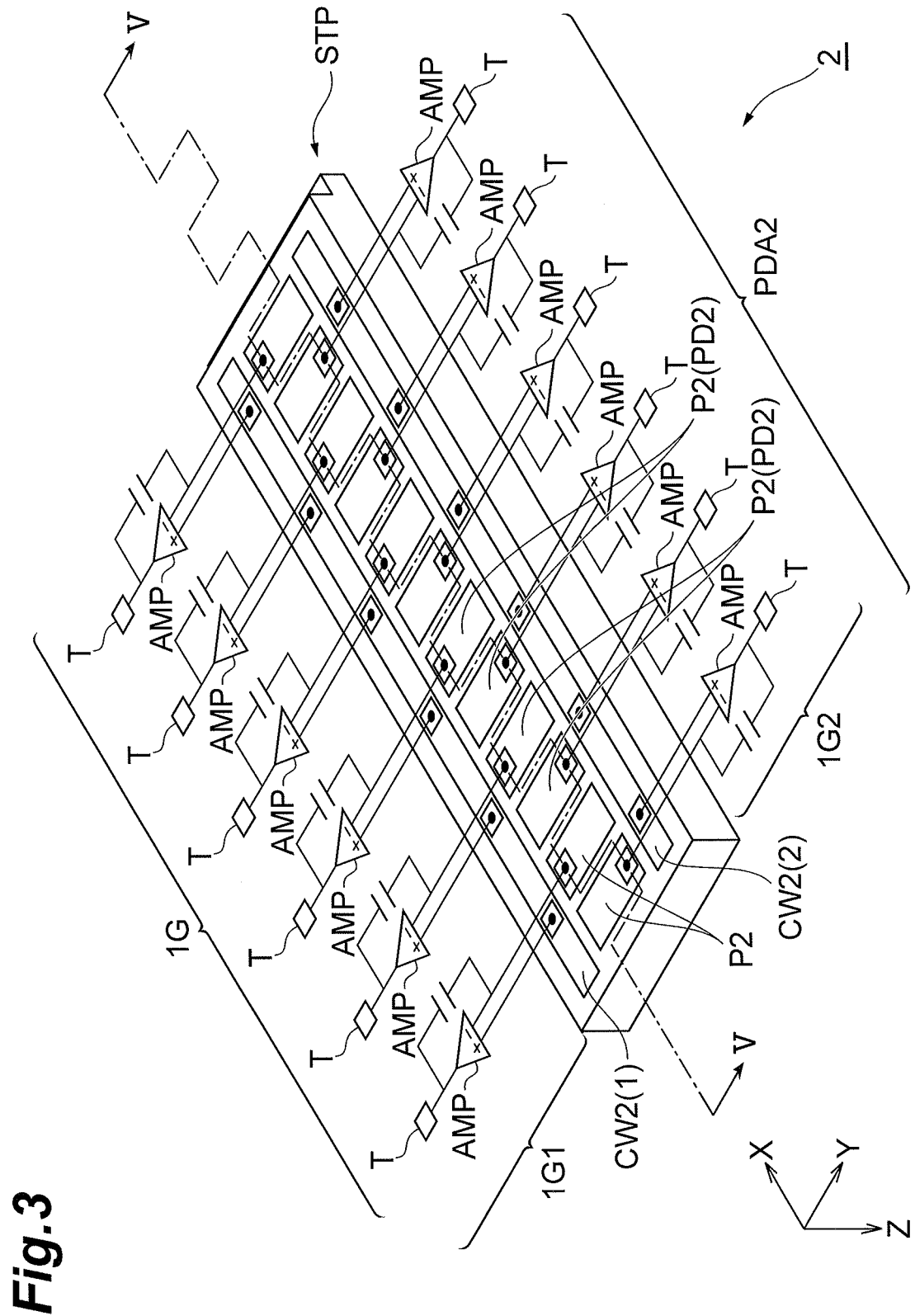
FIG. 3 is a perspective view of a first semiconductor substrate 2.
Figure 4:
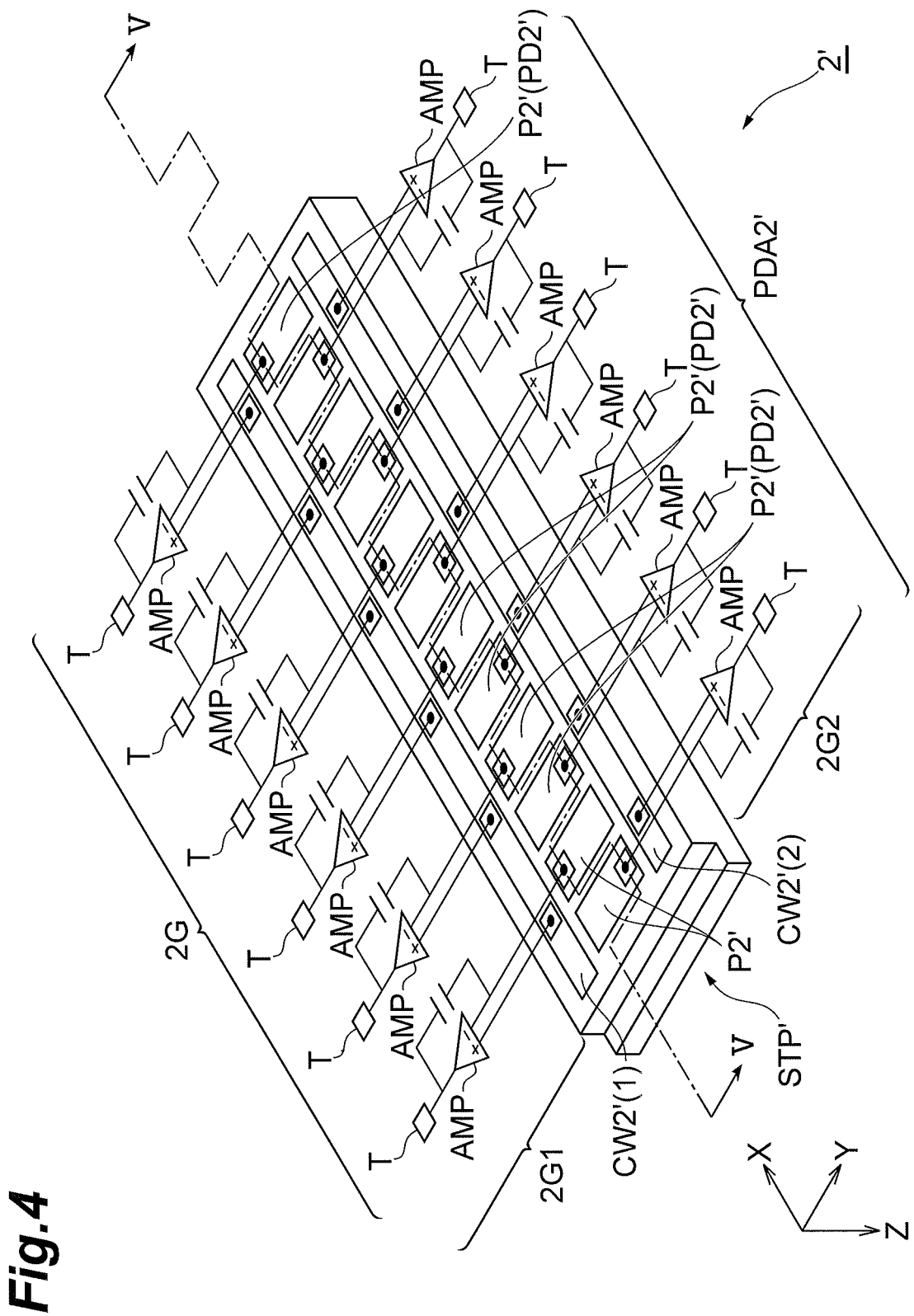
FIG. 4 is a perspective view of a second semiconductor substrate 2'.

FIG. 3 is a perspective view of the first semiconductor substrate 2, and FIG. 4 is a perspective view of the second semiconductor substrate 2'. The first semiconductor substrate 2 and the second semiconductor substrate 2' shown in FIG. 3 and FIG. 4, respectively, are shown inverted upside down from the ones shown in FIG. 1. Moreover, FIG. 5 is a sectional view taken along arrows V-V of the photodiode array module shown in FIG. 1, and FIG. 6 is an enlarged view of a region VI of the photodiode array module shown in FIG. 5.

The first semiconductor substrate 2 shown in FIG. 3 has a stepped portion STP at an end portion close to the second photodiode array (PDA2') side. The stepped portion STP, referring to FIG. 5 or FIG. 6, has a first side surface S1 and a second side surface S2 along the thickness direction (Z-axis) of the first semiconductor substrate 2 and a terrace surface ST located at the boundary between the first side surface S1 and the second side surface S2 and opposed to the third semiconductor substrate 3. The front surface, back surface, and terrace surface ST of the first semiconductor substrate 2 are XY planes, and the first side surface S1 and the second side surface S2 are both YZ planes.

Similarly, the second semiconductor substrate 2' shown in FIG. 4 has a stepped portion STP' at an end portion close to the first photodiode array (PDA2) side. The stepped portion STP', referring to FIG. 5 or FIG. 6, has a third side surface S1' and a fourth side surface S2' along the thickness direction (Z-axis) of the second semiconductor substrate 2' and a terrace surface ST' located at the boundary between the third side surface S1' and the fourth side surface S2' and opposed to the third semiconductor substrate 3. The front surface, back surface, and terrace surface ST' of the second semiconductor substrate 2' are XY planes, and the third side surface S1' and the fourth side surface S2' are both YZ planes.

Figure 5:
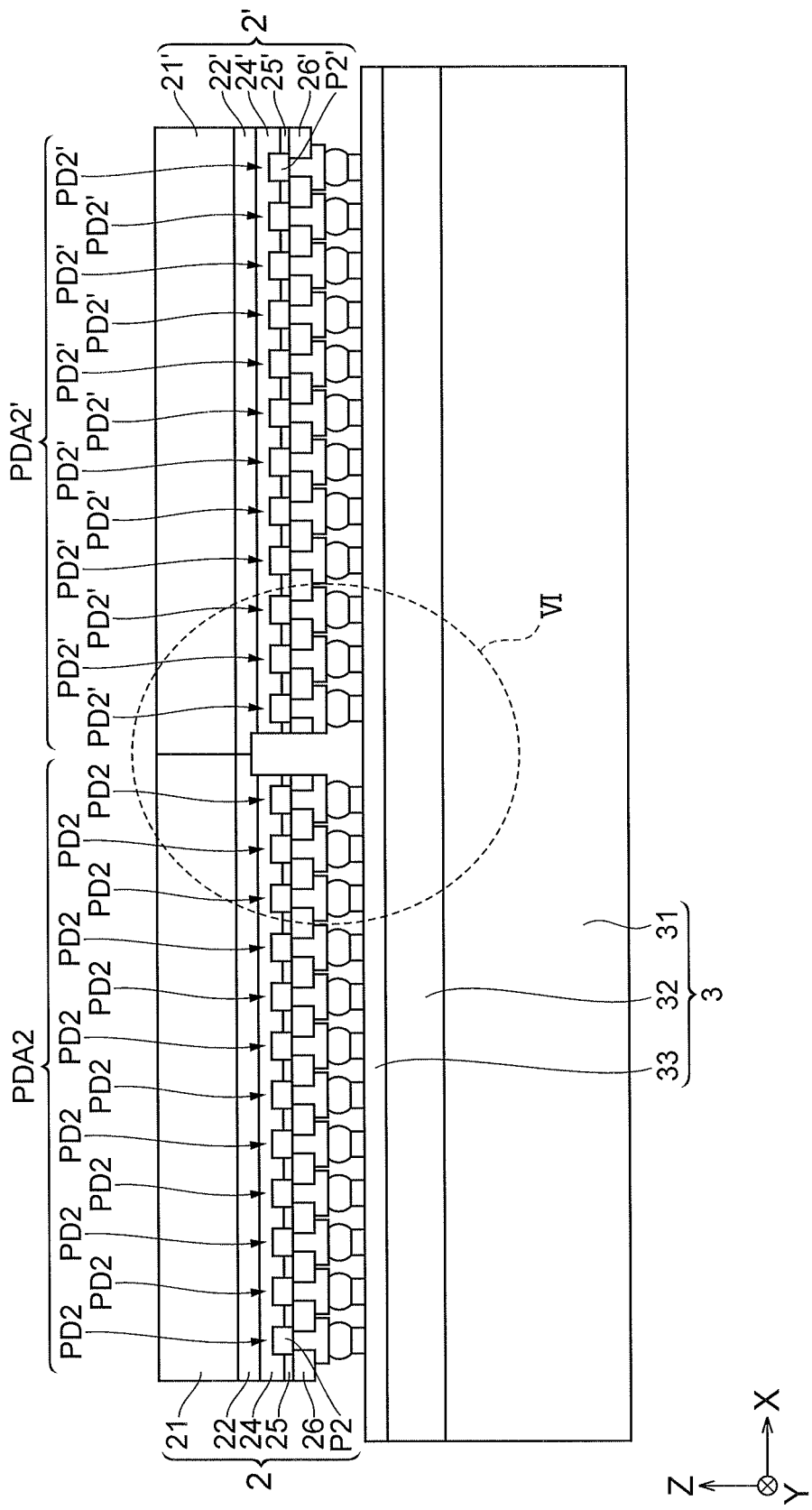
FIG. 5 is a sectional view taken along an arrow line V-V of the photodiode array module shown in FIG. 1.
Figure 6:
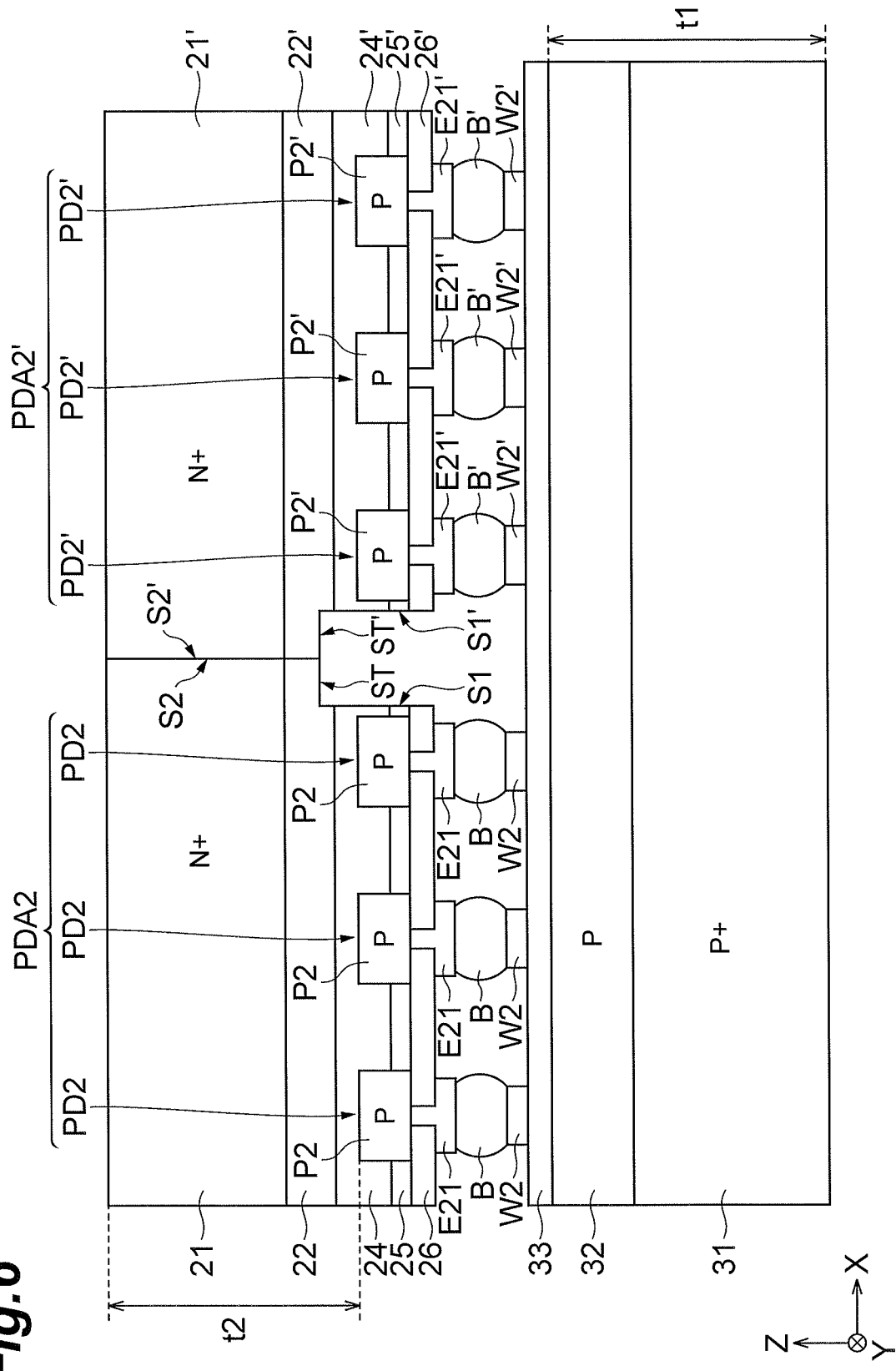
FIG. 6 is an enlarged view of a region VI of the photodiode array module shown in FIG. 5.

As shown in FIG. 5, the first photodiode array PDA2 includes a plurality of photodiodes PD2 aligned along the X-axis direction, and the second photodiode array PDA2' also includes a plurality of photodiodes PD2' aligned along the X-axis direction. Also, FIG. 5 is indeed a sectional view taken along an arrow line V-V of the module shown in FIG. 1, but this section is accurately a section in the case of an arrow line V-V for which an arrow line V-V is drawn zigzag, as shown in FIG. 3 and FIG. 4.

Figure 7:
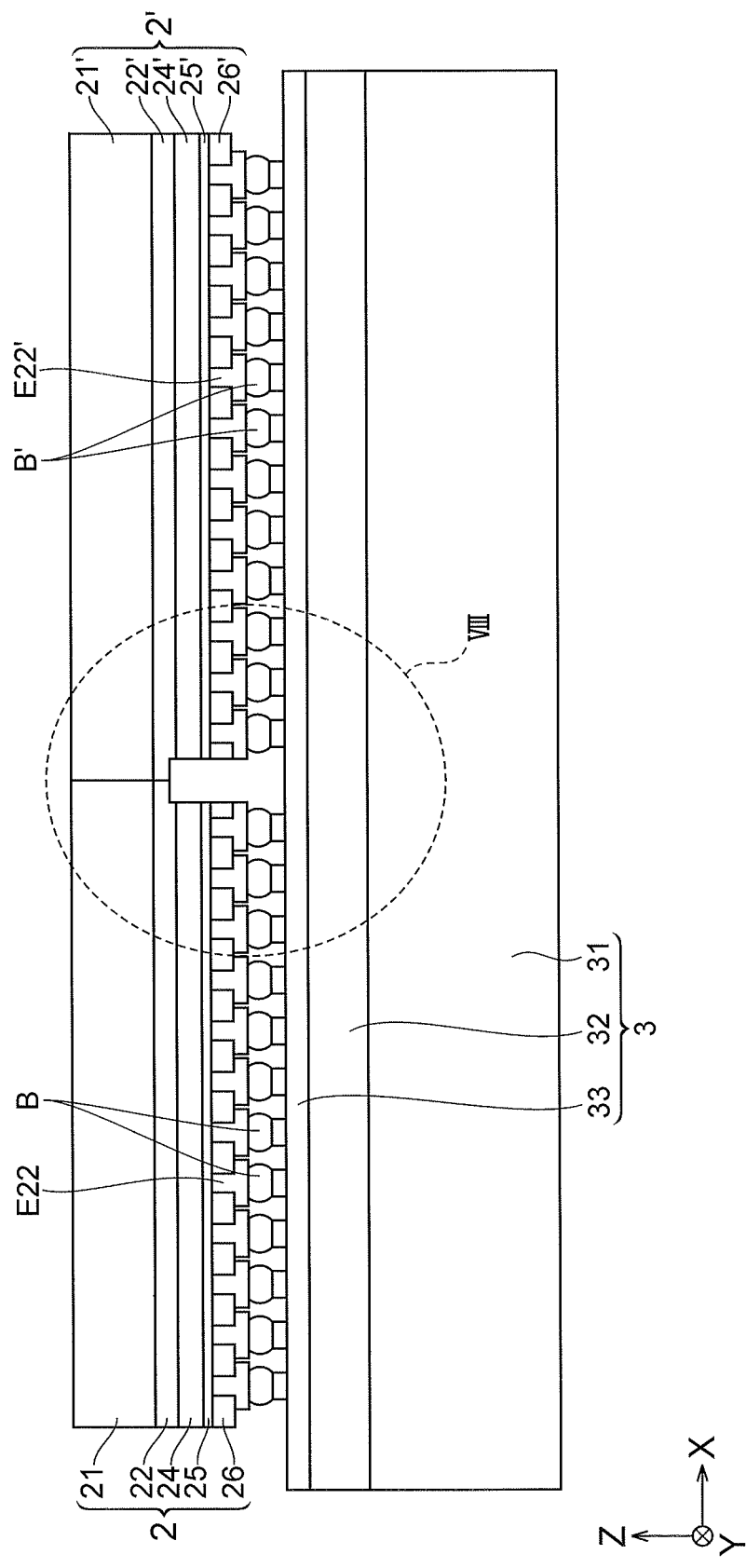
FIG. 7 is a sectional view taken along an arrow line VII-VII of the photodiode array module shown in FIG. 1.
Figure 8:
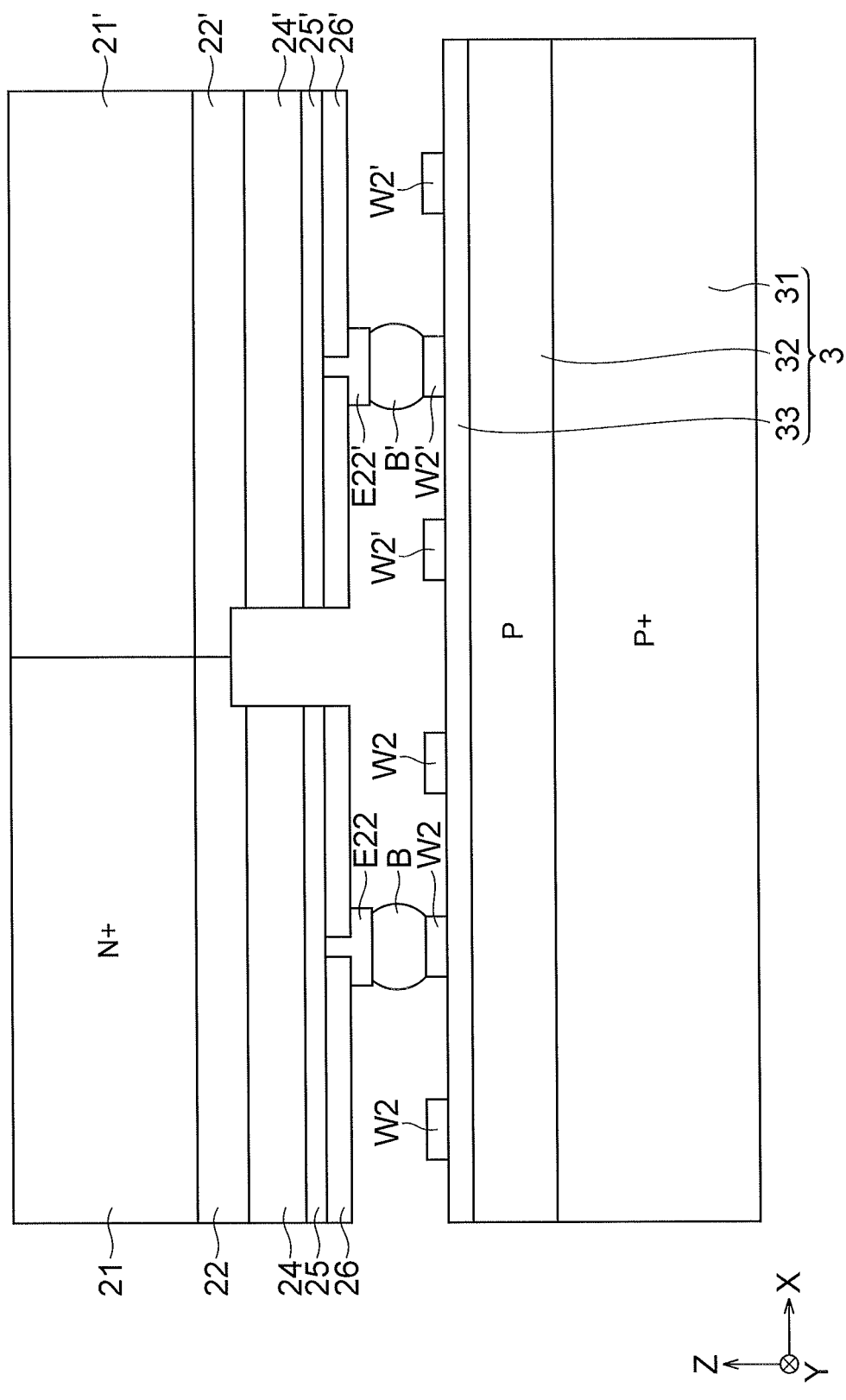
FIG. 8 is an enlarged view of a region VIII of the photodiode array module shown in FIG. 7.

Moreover, FIG. 7 is a sectional view taken along arrows VII-VII of the photodiode array module shown in FIG. 1, and FIG. 8 is an enlarged view of a region VIII of the photodiode array module shown in FIG. 7.

Referring to FIG. 5 and FIG. 8, the third semiconductor substrate 3 includes a semiconductor substrate 31 having a high impurity concentration and an epitaxial layer 32 formed on the semiconductor substrate 31, on the epitaxial layer 32 of the front surface, an insulating layer 33 made of $SiO_2$ or $SiN_X$ is formed. On the insulating layer 33, wirings W2 and W2' for connecting the amplifiers AMP and the respective photodiodes are patterned and formed. The wirings are formed of aluminum or the like.

The material/conductivity type/thickness (range)/impurity concentration (range) of the respective layers in the third semiconductor substrate 3 are as follows. Also, as an N-type impurity into Si, a quinquevalent element (N, P, or As) can be used, and as a P-type impurity, a triad element (B or Al) can be used. In the epitaxial layer 32, there are formed a plurality of field-effect transistors to form an amplifier AMP.

Semiconductor substrate 31: Si/P type/200~800 μm/1× $10^{16}$~1×$10^{18}$ cm$^{-3}$ Epitaxial layer 32: Si/P type/5~20 μm/1×$10^{15}$~1×$10^{17}$ cm$^{-3}$ Moreover, the first semiconductor substrate 2 includes a semiconductor substrate 21 having a high impurity concentration, a buffer layer 22 formed on the semiconductor substrate 21, a light absorbing layer 24 formed on the buffer layer 22, and a cap layer 25 formed on the light absorbing layer 24. Further, the first semiconductor substrate 2 includes pixel regions P2 of a second conductivity type (P type) formed in the cap layer 25 and the light absorbing layer 24.

On the cap layer 25 of the front surface, an insulating layer 26 made of $SiO_2$ or $SiN_X$ is formed, into contact holes provided in the insulating layer 26, contact electrodes E21 are embedded, and the contact electrodes E21 are connected with patterned wirings W2 physically and electrically via bumps B. The wirings W2 are located on the insulating layer 33.

The material/conductivity type/thickness (range)/impurity concentration (range) of the respective layers in the first semiconductor substrate 2 are as follows. Also, as an N-type impurity into InGaAs or InP, S or Si can be used, and as a P-type impurity, Zn can be used.

- Semiconductor substrate 21: InP/N type/100~1000 μm/1× $10^{17}$~1×$10^{20}$ cm$^{-3}$
- Buffer layer 22: InP/N type/1~10 μm/1×$10^{17}$~1×$10^{20}$ cm$^{-3}$
- Light absorbing layer 24: InGaAs N type/1~7 μm/1× $10^{15}$~1×$10^{17}$ cm$^{-3}$
- Cap layer 25: InP/N type/0.1~2 μm/1×$10^{16}$~1×$10^{18}$ cm$^{-3}$
- Pixel region P2: InP/InGaAs/P type/0.1~3 μm/1×$10^{17}$~1× $10^{19}$ cm$^{-3}$ Each photodiode PD2 in the first semiconductor substrate 2 includes the semiconductor region 24, 25 of a first conductivity type (N type) and the pixel region P2 made of a semiconductor of the second conductivity type (P type) located at a surface layer side of a surface of the semiconductor region 24, 25 opposed to the third semiconductor substrate 3. The plurality of pixel regions P2 are aligned along the X-axis, and intermittently arrayed up to a position before leading to an end portion close to the second semiconductor substrate 2' side. The interface between the P-type semiconductor region P2 and the N-type semiconductor region 24, 25 constructs a p-n junction, and a depletion layer spreads from the p-n junction interface.

With no bias voltage applied to the photodiode PD2, because the depletion layer is generated by recombination of holes and electrons in the vicinity of the p-n junction plane, the dimensions of the depletion layer depend on the impurity concentrations in the pixel region P2 and the semiconductor region 24 to supply holes and electrons. Because the depletion layer has photosensitive properties, if this depletion layer spreads up to a region where noise is generated, noise is likely to be superimposed on an output of the photodiode PD2. Particularly, in the end portion close to the second photodiode array side in the first semiconductor substrate 2, because there is damage introduced during dicing, it is preferable to suppress noise to be generated in such a place.

In a photodiode, the response speed can be improved by decreasing junction capacitance to be defined by a depletion layer simultaneously with controlling spreading of said depletion layer. If a non-doped layer is used between the buffer layer 22 and the light absorbing layer 24, the thickness of the depletion layer increases, so that the junction capacitance decreases, and accordingly, it also becomes possible in this device to improve the response speed.

In the present example, directly under the light absorbing layer 24 (in the figure, the positive Z-axis direction is assumed as a direction being directly under regarding the first semiconductor substrate 2), the buffer layer 22 and the semiconductor substrate 21 having an impurity concentration higher than that of the light absorbing layer 24 is located to restrict the depletion layer from spreading in the thickness direction. Moreover, in the end portion of the first semiconductor substrate 2, dicing is performed using a diamond-made dicing blade in a region outside the depletion layer. That is, the first side surface S1 in the end portion is formed by etching, and the first side surface S1 exists in terms of the depth in the Z-axis direction thereof at a position deeper than that of the light absorbing layer 24. In the example described above, the first side surface S1 reaches the buffer layer 22, but this may be provided so as to reach the substrate 21. Because the second side surface S2 having a high crystal defect density is located outside the depletion layer serving as a carrier generating region, even when the pixel region P2 is brought close to the substrate end portion, a noise component to be mixed with an output signal can be suppressed.

Particularly, during dicing, the second side surface easily produces a shell crack, and this functions as a major defect, but because the second side surface S2 exists at a position separated from the pixel region P2, cracks and noise in the pixel region P2 caused by the shell crack can also be suppressed. Also, when a shell crack is generated, a range where current easily flows approximates an impurity diffusion part serving as the pixel region P2, and in the case of not using etching, depending on the size of the shell crack, the range may cause a short-circuit with this diffusion part or reach a very close position, and the depletion layer may even reach the shell crack part when a bias is applied. Moreover, even when insulation between the shell crack and diffusion region has been maintained initially, an electrical short-circuit easily occurs due to ionization of moisture under a high humidity environment, and there is a concern for a short life. On the other hand, in the above-described embodiment, because the position to generate a shell crack is separated, these problems are suppressed.

The terrace surface ST located in the end portion of the first semiconductor substrate 2 is located at a deepest portion of the first side surface S1. The depth of the terrace surface ST from the opposing surface of the first semiconductor substrate 2 to the third semiconductor substrate is deeper than the depth of at least the pixel region P2 of the second photodiode array. This is because, when the depth of the terrace surface ST is shallower than that of the pixel region P2, the second side surface S2 having a high crystal defect density comes to be adjacent laterally to the pixel region P2, and noise is mixed therein. The deeper the position the terrace surface ST exists at, the smaller the influence of noise is exerted, but because an etching step takes longer time than that of a dicing step, dicing is performed from a spot to have smaller influence of noise due to a defect so as to cut the substrate. Thus, the first side surface S1 exists at a position closer to the third semiconductor substrate 3 than the second side surface S2, but using etching allows making the crystal defect density in the first side surface S1 lower than the crystal defect density in the second side surface S2, which then allows bringing the pixel region P2 close to the side surface S1 with suppressed noise.

It becomes possible to set the closest distance from the first side surface S1 to the pixel region P2 to 3 μm or more.

Also, the structure of the second semiconductor substrate 2' is the same as that of the first semiconductor substrate 2 except for the composition, and corresponds to the explanation regarding the first semiconductor substrate 2 in which "'" are added to the reference signs to rephrase the sentences. Also, the first side surface S1 and the second side surface S2 in the first semiconductor substrate 2 correspond to, in the second semiconductor substrate 2', the third side surface S1' and the fourth side surface S2', and these and the terrace surface ST' compose the stepped portion STP'. Also in the second semiconductor substrate 2', it becomes possible to set the closest distance from the third side surface S1' to the pixel region P2' to 3 μm or more.

Referring to FIG. 3 and FIG. 4, the structures of the first semiconductor substrate 2 and the second semiconductor substrate 2' will be explained in detail.

In the respective substrates, the common wirings CW2(1), CW2(2) and CW2'(1), CW2'(2) that are electrically connected to N-type semiconductor regions to construct cathodes of the first photodiode array PDA2 and cathodes of the second photodiode array PDA2' include the first common wirings CW2(1), CW2'(1) extending in a direction along which the above-mentioned pixel region is arrayed in plural numbers and the second common wirings CW2(2), CW2'(2) extending parallel to the first common wirings CW2(1), CW2'(1).

Moreover, there are located insulating layers 26, 26' on the cap layers 25, and into contact holes provided in the insulating layers 26, 26', contact electrodes E22, E22' are embedded, and the common wirings CW2(1), CW2(2) and CW2'(1), CW2'(2) are, via the contact electrodes E22 and E22' and wirings W2 and W2' connected to these via bumps B and B', connected to the non-inverting input terminals (+) of the amplifiers AMP (refer to FIG. 2). Also, in FIG. 8, a state is shown in which the wirings W2 and W2' extending from the contact electrodes E21 (refer to FIG. 6) are located on the insulating layer 33, and the contact electrodes E21 and E21' are connected to the inverting input terminals (−) of the amplifiers AMP (refer to FIG. 2). This longitudinal sectional structure is of a section taken through the common wirings CW2(1) and CW2'(1) (refer to FIG. 3 and FIG. 4), but a sectional structure taken through the common wirings CW2(2) and CW2'(2) (refer to FIG. 3 and FIG. 4) is also the same.

Referring again to FIG. 3 and FIG. 4, the pixel regions P2 and P2' are located in regions between the common wiring CW2(1), CW2'(1) and the common wiring CW2(2), CW2'(2). Also, the amplifiers AMP are formed on the third semiconductor substrate 3.

Referring to FIG. 1 to FIG. 4, each group 1G, 2G of amplifiers AMP on the third semiconductor substrate 3 includes a first outer amplifier group 1G1, 2G1 and a second outer amplifier group 1G2, 2G2. The first outer amplifier groups 1G1, 2G1 are located outside further than the regions (refer to FIG. 3 and FIG. 4) between the first and second semiconductor regions of the respective substrates. Similarly, the second outer amplifier groups 1G2, 2G2 are located outside further than the regions between the first and second semiconductor regions of the respective substrates.

The first outer amplifier groups 1G1, 2G1 are located at positions closer to the first common wirings CW2(1) and CW2'(1) than the common wirings CW2(2) and CW2'(2), and the second outer amplifier group 1G2 are 2G2 are located at positions closer to the common wirings CW2(2) and CW2'(2) than the common wirings CW2(1) and CW2'(1).

The pixel regions P2 and P2' of the respective substrates are, along their array direction (X-axis), electrically connected to one-side terminals (−) of the first outer amplifier groups 1G1, 2G1 and the second outer amplifier groups 1G2, 2G2 alternately.

That is, the first pixel region P2 from the left in FIG. 3 is connected to the inverting terminal (−) of the amplifier AMP of the outer amplifier group 1G2, the second pixel region P2 is connected to the inverting terminal (−) of the amplifier AMP of the outer amplifier group 1G1, the third pixel region P2 is connected to the inverting terminal (−) of the amplifier AMP of the outer amplifier group 1G2, and the fourth pixel region P2 is connected to the inverting terminal (−) of the amplifier AMP of the outer amplifier group 1G 1. Where MOD (N,2)+1=k, the N-th pixel region P2 from the left is connected to the inverting terminal (−) of the amplifier AMP of the k-th outer amplifier group 1Gk. Also, MOD (N,2) is an operator indicating a remainder when N is divided by 2.

Moreover, the other-side terminals (+) of the first outer amplifier group 1G1 and the other-side terminals (+) of the second outer amplifier group 1G2 are electrically connected to the common wirings CW2(1) and CW2(2), respectively. The patterned wirings W2 are used for connections between the amplifiers AMP and the respective regions of the photodiodes PD2.

Similarly, the first pixel region P2' from the left in FIG. 4 is connected to the inverting terminal (−) of the amplifier AMP of the outer amplifier group 2G2, the second pixel region P2' is connected to the inverting terminal (−) of the amplifier AMP of the outer amplifier group 2G1, the third pixel region P2' is connected to the inverting terminal (−) of the amplifier AMP of the outer amplifier group 2G2, and the fourth pixel region P2' is connected to the inverting terminal (−) of the amplifier AMP of the outer amplifier group 2G1. Where MOD (N,2)+1=k, the N-th pixel region P2' from the left is connected to the inverting terminal (−) of the amplifier AMP of the k-th outer amplifier group 2Gk.

Moreover, the other-side terminals (+) of the first outer amplifier group 2G1 and the other-side terminals (+) of the second outer amplifier group 2G2 are electrically connected to the common wirings CW2'(1) and CW2'(2), respectively. The patterned wirings W2' are used for connections between the amplifiers AMP and the respective regions of the photodiodes PD2'.

In the foregoing structure, because the amplifiers AMP are located on both sides of the respective pixel regions P2 and P2', the number of amplifiers disposed per unit length in the array direction of the pixel regions P2 and P2' can be increased, and the pitch of the pixel regions P2 and P2' can be narrowed to increase resolution.

Moreover, according to the above-described photodiode array module, because the crystal defect density of the first side surface of the first stepped portion STP is low, photodiodes can be brought close thereto, and because the crystal defect density of the third side surface of the second stepped portion STP' is low, photodiodes can be brought close thereto. Accordingly, it becomes possible to place the first semiconductor substrate 2 and the second semiconductor substrate 2' horizontally without overlapping each other so as to array the photodiodes (pixels) of both successively. Moreover, because the first and second semiconductor substrates 2, 2' are not overlapping, generation of stress in an overlapping part can be suppressed and a focusing position of an incident light with respect to the first and second semiconductor substrates 2, 2' can also be set to the same position, so that a precise measurement is enabled.

Moreover, in the foregoing structure, outputs of all of the respective amplifiers AMP can be taken out from terminals T, but the respective terminals T can also be connected to a circuit (a shift register) that converts a parallel output from a plurality of terminals T to a serial output. Moreover, as shown in FIG. 2, between the input and output terminals of each amplifier AMP, a capacitor C is interposed, which allows converting an output charge to a voltage. That is, the amplifiers AMP are charge amplifiers, and the amplifiers AMP are operational amplifiers, and there is a virtual short-circuit between the two input terminals of each. Accordingly, the respective photodiodes PD2, PD2' can be driven at zero bias, which allows restricting a depletion layer from spreading excessively. In terms of the structure of operational amplifiers, various types of operational amplifiers such as ones using CMOS can be used.

Figure 14:
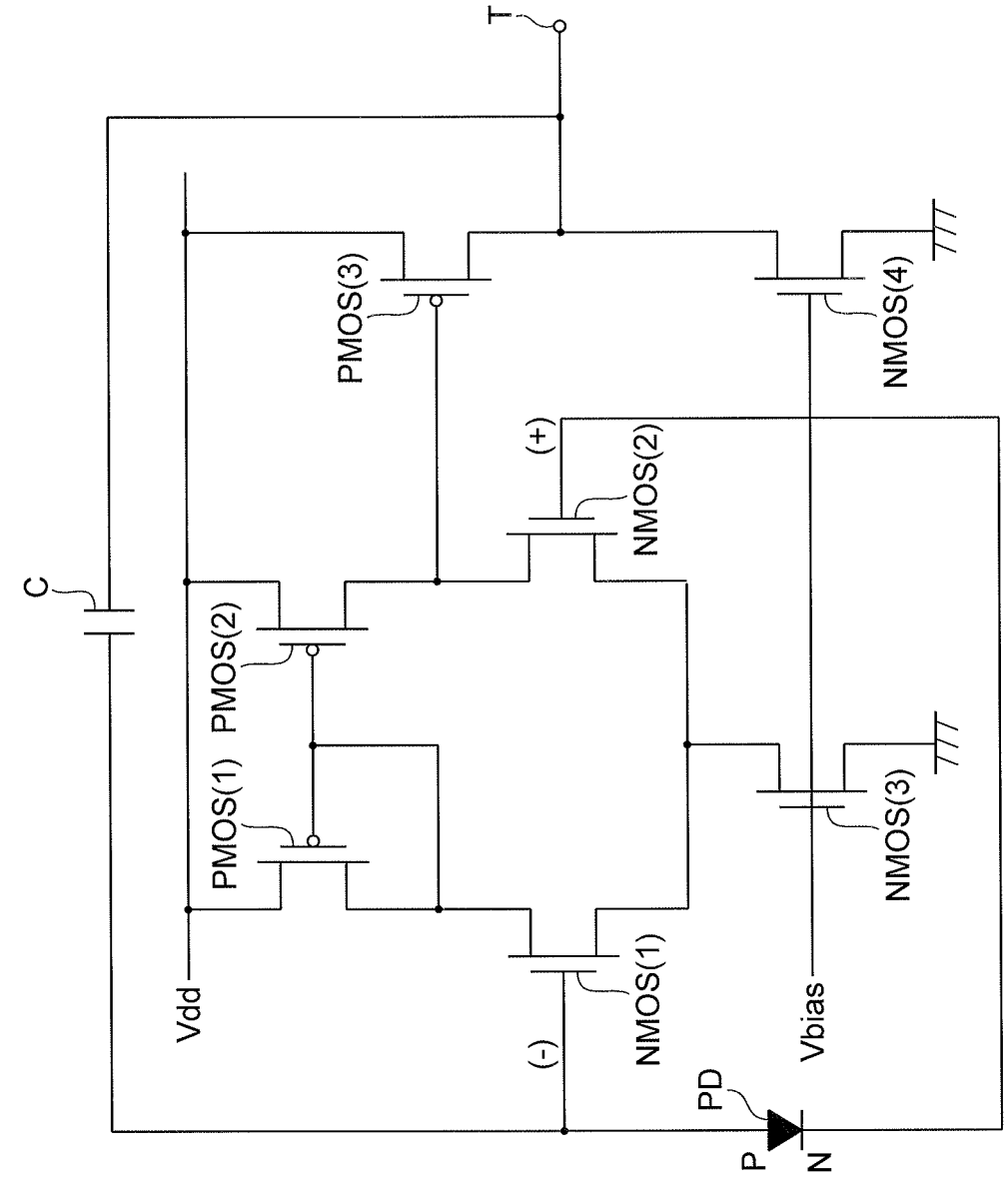
FIG. 14 is a circuit diagram of an amplifier.

FIG. 14 is a circuit diagram showing an example of the amplifiers AMP. The anode of the foregoing photodiode PD (PD2, PD2') is connected to the inverting input terminal (−), and the cathode is connected to the non-inverting input terminal (+). An operational amplifier is constructed by connecting the P-channel field-effect transistor PMOS and the N-channel field-effect transistor NMOS as illustrated. The operational amplifier is connected with a power supply line Vdd and a ground potential, and the gates of the NMOS(3) and NMOS(4) adjacent to the ground potential are applied with a bias potential Vbias to provide a function as a constant current source. A potential difference generated between both ends of the photodiode PD is detected by a differential pair (NMOS(1), NMOS(2)), and from one of the transistors of a current mirror circuit (PMOS(1), PMOS(2)), a current larger than that of the other transistor is supplied, and an input potential difference is transmitted to the subsequent stage of an amplifier circuit (PMOS(3), NMOS(4)), and amplified and output from the terminal T. Also, it suffices to use ordinary methods as methods of manufacturing photodiodes, amplifiers, and capacitors.

According to the above-described photodiode array module, because the first semiconductor substrate 2 and the second semiconductor substrate 2' are different in composition, the first photodiode array PDA2 and the second photodiode array PDA2' formed thereon have their sensitivities to incident light of mutually different wavelength bands. The composition A of InGaAs in the foregoing is $In_{0.53}Ga_{0.47}As$, and the composition B is $In_{0.82}Ga_{0.18}As$.

Also, as shown in FIG. 6, the distance t2 from the back surface of the semiconductor substrate 2, 2' to the pixel regions P2, P2' is shorter than the distance t1 from the back surface to the front surface of the third semiconductor substrate 3, which provides a configuration where light incident from the semiconductor substrate 2, 2' side is transmitted through the semiconductor substrate 2, 2' to be sufficiently made incident on a depletion layer near the pixel region P2, P2'.

As shown in FIG. 1, because the respective photodiodes PD2, PD2' of the photodiode arrays PDA2, PDA2' are connected to the amplifiers AMP, outputs of the photodiodes PD2, PD2' are output to the outside after amplification.

Outputs of the photodiodes of the semiconductor substrate 2, 2' are input to each group 1G, 2G of amplifiers AMP via the bumps (B, B') and the wiring group W2, W2', and taken out to the outside via these amplifiers AMP. Here, an end portion of the semiconductor substrate 2, 2' has a stepped portion STP, STP'. The stepped portion STP, STP' includes a side surface S1, S1' close to the third semiconductor substrate 3 and a side surface S2, S2' distant from the third semiconductor substrate 3, but the crystal defect density of the side surface S1, S1' is relatively low, so that the harmful influence on the photodiode array PDA2, PDA2' is reduced.

FIG. 9 includes views for explaining the effect of a stepped portion of the first semiconductor substrate 2. Also, this effect is the same as with a stepped portion of the second semiconductor substrate 2'.

Because approximating the second side surface S2 and a closest photodiode (pixel region P2) of the second photodiode array PDA2 to each other also suppresses degradation in output of this photodiode, it is not necessary to remove said photodiode. Accordingly, in such a structure, a reduction in the number of photodiodes per module can be suppressed.

That is, in the foregoing embodiment, as shown in FIG. 9(A), etching is performed up to a deep position, and then dicing is performed. In this case, a large quantity of crystal defects are introduced into the side surface S2 as shown by an arrow D, but this position is outside a depletion layer, and the influence on the pixel regions P2 is slight. On the other hand, when etching is not performed, as shown in FIG. 9(B), a large quantity of crystal defects are introduced over the entire region of the side surface as shown by arrows D, and due to the crystal defects, noise is mixed in the pixel region P2 close to the side surface. As shown in FIG. 9(C), when the cut surface is remarkably isolated, a large quantity of crystal defects are introduced into the entire region of the side surface as shown by arrows D, but have small influence on the pixel regions P2. However, the third semiconductor substrate must be disposed isolated remarkably in such a case, which no longer allows performing spatially continuous imaging.

Next, the manufacturing method will be described.

In this method of manufacturing a photodiode array module, first, as shown in FIG. 1, a plurality of amplifiers AMP are formed, and a third semiconductor substrate 3 made of a semiconductor material and semiconductor substrates 2 and 2' made of first and second semiconductor materials that need to be adhered to the third semiconductor substrate 3 are prepared.

As a method of manufacturing the semiconductor substrate 2, a buffer layer 22, a light absorbing layer 24, and a cap layer 25 are grown in sequence on a semiconductor layer 21. For the growth, a metalorganic chemical vapor deposition (MOCVD) method can be used. As a method of manufacturing the semiconductor substrate 2', a buffer layer 22', a light absorbing layer 24', and a cap layer 25' are grown in sequence on a semiconductor layer 21'. For the growth, a metalorganic chemical vapor deposition (MOCVD) method can be used. As source gases when growing InP or InGaAs, trimethylindium (TMI), trimethylgallium (TMGa), and trimethylarsine (TMAs) can be used.

Subsequently, pixel regions P2 and P2' of the second conductivity type (P type) located at a surface layer side of surfaces of the semiconductor substrates 2 and 2' opposed to the third semiconductor substrate 3 are formed to form photodiode arrays PDA2 and PDA2'. That is, by using a photolithography technique, a P-type impurity is diffused into pixel forming regions thereof to form pixel regions P2 and P2' serving as anodes. Subsequently, an insulating layer 26, 26' is formed on the cap layer 25, 25' by a CVD method, contact holes are opened therein, and contact electrodes E21, E22 and E21', E22' are formed inside. Subsequently, by patterning wirings W2 and W2' to connect the contact electrodes E21, E22 and E21', E22' with the input terminals (−, +) of the amplifiers AMP with aluminum or the like on the third semiconductor substrate 3, semiconductor substrates 2 and 2' formed with photodiode arrays are completed. The respective electrodes on the cathode side are connected using common wirings.

Figure 13:
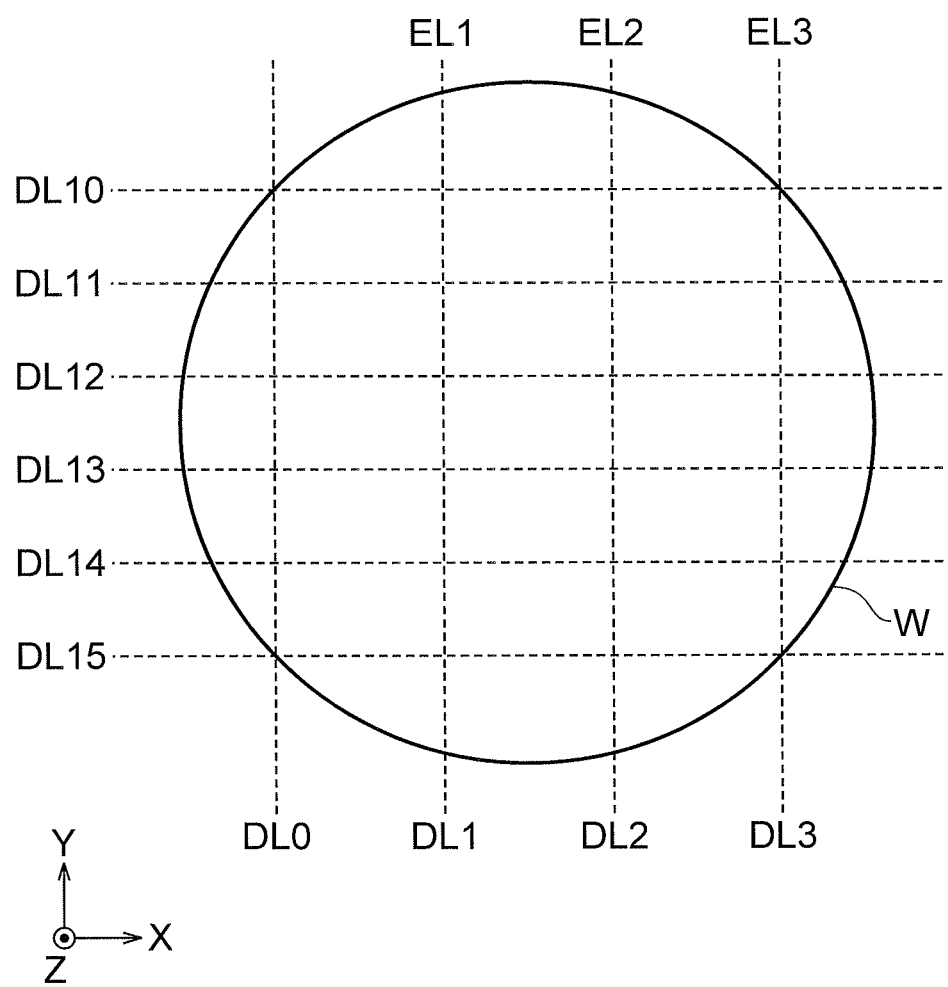
FIG. 13 is a plan view of a wafer from which semiconductor substrates are manufactured.

Of course, the semiconductor substrate 2, 2' is, as shown in FIG. 13, formed in plural numbers in a wafer W.

Also, as described above, by forming the wiring groups W2, W2' via the insulating layer 33 on the third semiconductor substrate 3, the respective pixel regions of the first photodiode array PDA2 and the first group 1G of amplifiers AMP are electrically connected via the wiring group W2, and the wiring group W2' and the second group 2G of amplifiers AMP are electrically connected. That is, the third semiconductor substrate 3 and the semiconductor substrates 2 and 2' are adhered to each other, the photodiode arrays PDA2, PDA2' are disposed on the wiring groups W2 and W2' via the bumps B and B', and the wiring groups W2 and W2' and each of the pixel regions P2 and P2' of the photodiodes are electrically connected.

For this wafer W, by performing etching and dicing after formation of respective elements, the semiconductor substrate 2 or 2' shown in FIG. 1 is separated from the wafer. As this etching and dicing, as shown in FIG. 13, dicing is performed along dicing lines DL10 to DL15 in the longitudinal direction (X-axis) of the semiconductor substrate 2 or 2', and in the lateral direction (Y-axis), etching lines EL1, EL2, EL3 are set only at spots where semiconductor substrates 2, 2' are adjacent, and dicing lines DL1 to DL3 are set so as to overlay the etching lines EL1, EL2, EL3. That is, after performing etching along the etching lines EL1, EL2, EL3, dicing is performed along these dicing lines DL1 to DL3 to form stepped portions. At a site not to be adjacent, a dicing line DL0 in the Y-axis direction can be separately set.

FIG. 10 includes views showing a formation process of a stepped portion of the first semiconductor substrate 2. Also, the formation process of a stepped portion of the second semiconductor substrate 2' is the same as this.

A resist R is coated on the front surface of a wafer including the first semiconductor substrate 2, and exposure and development is performed along an etching line so that the resist R has an opening (FIG. 10(A)). Thus, a line-shaped opening H1 is formed in the resist R. Next, an insulating film 26 of the front surface is etched using the resist R as a mask (FIG. 10(B)). This etching may be wet etching using a hydrofluoric acid aqueous solution, and may be dry etching using a chlorine-based etching gas. Here, wet etching is used for the etching.

Next, etching of the compound semiconductor is performed using the resist R and the insulating film 26 as a mask. In this etching, the wafer including the first semiconductor substrate 2 is etched up to a position deeper than the depth of the pixel regions P2 of the second photodiode array, in the present example, until reaching the buffer layer 22 (FIG. 10(C)). Here, wet etching is used for the etching. As an etchant for InP, a mixture of hydrochloric acid and phosphoric acid or an ordinarily used etchant such as a hydrochloric acid aqueous solution, a bromic acid-based etchant, or bromine-methanol can be used. As an etchant for InGaAs and InGaAsP, an ordinarily used etchant such as, for example, a citric acid-based etchant (a mixture of citric acid, hydrogen peroxide, and water) or a sulfuric acid-based etchant (a mixture of sulfuric acid, hydrogen peroxide, and water) can be used. Thus, an etched groove defined by the opening H1 is formed including one side surface (S1) of the first semiconductor substrate 2.

Further, by dicing a deepest portion of the etched groove along a dicing line, the first semiconductor substrate 2 is separated from the wafer (FIG. 10(D)). Also, the dicing is performed up to halfway through the semiconductor substrate 21, and in the case of separation, the semiconductor substrates are adhered to an expand tape, and separation is performed by expanding the expand tape, but of course, dicing may be performed until reaching the back surface of the substrate.

The first side surface S1 shown in FIG. 6 is a surface formed by etching the first semiconductor substrate 2 in its thickness direction, and the second side surface S2 is a surface formed by dicing the first semiconductor substrate 2 in its thickness direction. The density of crystal defects in a side surface produced by etching is smaller than the density of crystal defects in a side surface produced by dicing.

The above-described method includes a step of preparing a first wafer including the first semiconductor substrate 2 having the first photodiode array, a step of etching the first wafer along a first etching line EL1, EL2, EL3 to expose the first side surface S1, and a step of dicing the first wafer along a deepest portion of the first etching line EL1, EL2, EL3 to expose the second side surface S2. Similarly, this manufacturing method includes a step of preparing a second wafer including the second semiconductor substrate 2' having the second photodiode array, a step of etching the second wafer along a second etching line EL1, EL2, EL3 to expose the third side surface S1', and a step of dicing the second wafer along a deepest portion of the second etching line EL1, EL2, EL3 to expose the fourth side surface S2'.

Furthermore, this manufacturing method includes a step of adhering the first semiconductor substrate 2 and the second semiconductor substrate 2' to the third semiconductor substrate 3 via the bumps B and B', and electrically connecting each photodiode in the first semiconductor substrate 2 and the second semiconductor substrate 2' to each of the amplifiers AMP via the bump B, B'.

According to this method, the first semiconductor substrate 2 is separated from the wafer by etching the first semiconductor substrate 2 and then dicing a deepest portion of the etched groove. The density of crystal defects in the side surface S1 (refer to FIG. 6) produced by etching is smaller than the density of crystal defects in the side surface S2 (refer to FIG. 6) produced by dicing. Because the photodiode (pixel region P2) located in the end portion of the first semiconductor substrate 2 does not receive the influence of noise and therefore does not need to be removed, a reduction in the number of photodiodes can be suppressed. In this method, the influence on the first and second pixel regions from the second side surface and the fourth side surface can be suppressed, which enables a precise measurement.

Figure 11:
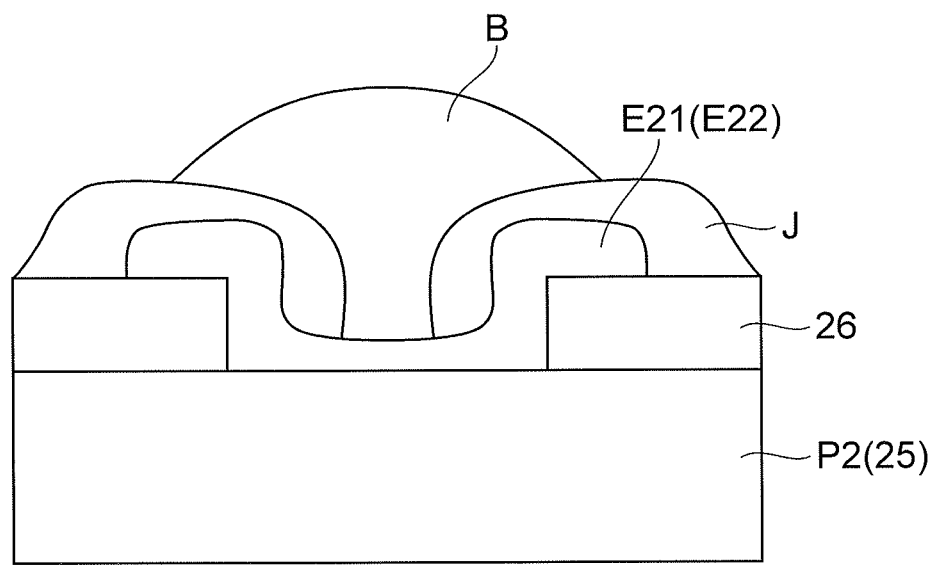
FIG. 11 is a view for explaining a bump structure.

FIG. 11 is a view showing a structure near a bump.

There is formed an insulating layer 26 on the semiconductor region P2 (or the cap layer 25), while there are formed contact holes in the insulating layer 26, and there are formed contact electrodes E21 (or E22) inside. Here, a resin layer J made of photosensitive polyimide or the like is interposed between the contact electrode (under bump metal) E21 (or E22) and the bump B. The resin layer J allows suppressing disconnection and electric field concentration near the bump B. Also, the bumps are made of a solder material, and the contact electrodes are made of a material such as Ti, Pt, and/or Au. Moreover, when the third semiconductor substrate and the first semiconductor substrate are bonded, the bumps B are provided not only on the first semiconductor substrate but also on wirings formed on the third semiconductor substrate 3, and melting and bonding of the bumps are performed with each pair of bumps opposed to each other. Also, this structure is the same near contact holes in the semiconductor region P2' of the second semiconductor substrate 2'.

Figure 12:
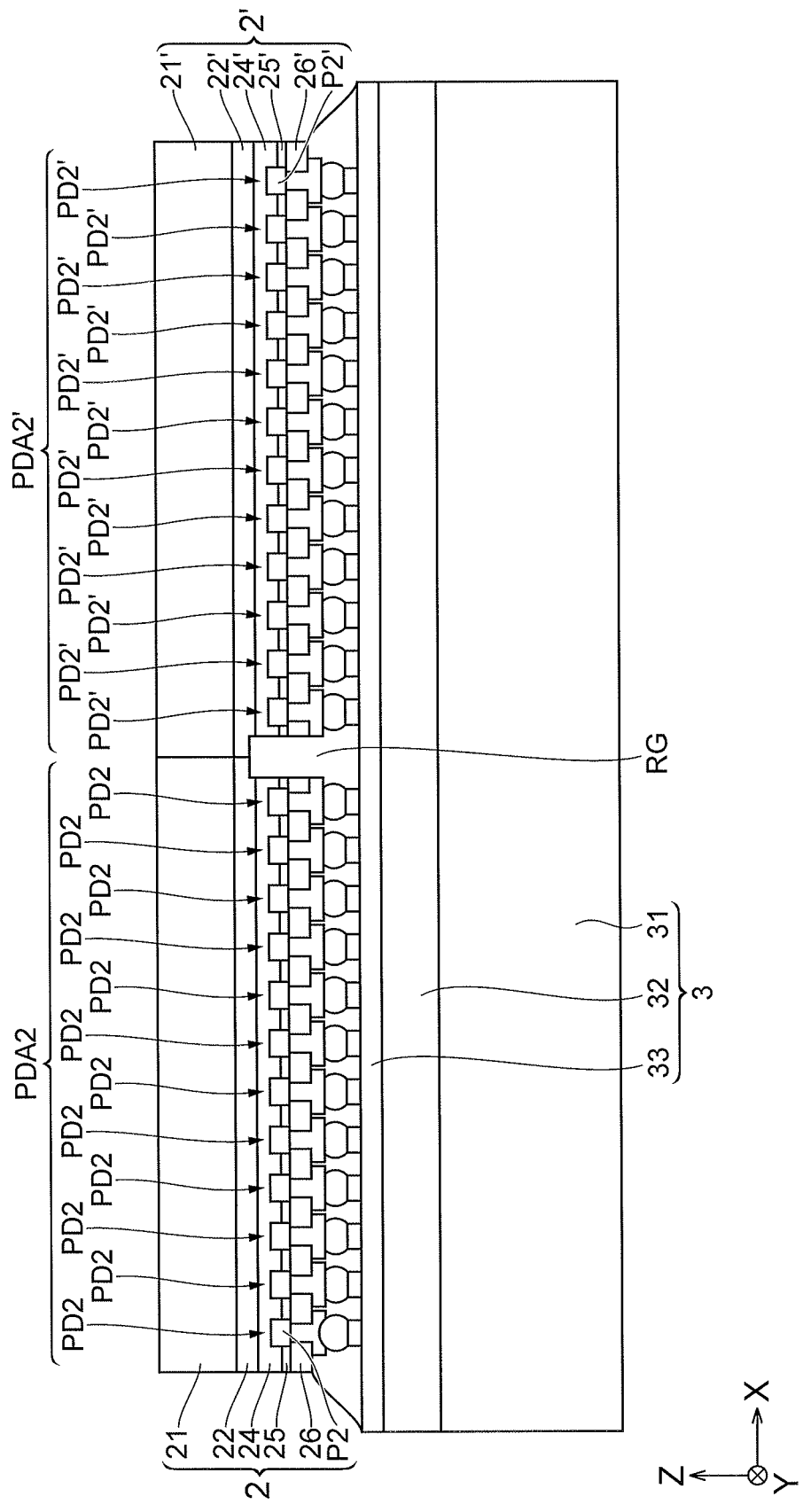
FIG. 12 is a sectional view of a photodiode array module with a resin layer interposed between substrates.

FIG. 12 is a sectional view of the photodiode array module including a resin layer.

Moreover, this photodiode array module further includes a resin layer RG interposed between the third semiconductor substrate 3 and the first and second semiconductor substrates 2 and 2'. In this case, the bonding strength between the third semiconductor substrate 3 and the semiconductor substrates 2 and 2' can be enhanced. The manufacturing method in this case further includes a step of interposing the resin layer RG between the third semiconductor substrate 3 and the semiconductor substrates 2 and 2', so that the bonding strength between the third semiconductor substrate 3 and the semiconductor substrates 2, 2' can be enhanced. The resin layer RG may be introduced between the substrates before adhesion of the substrates, but may be introduced after adhesion.

As the resin material, an epoxy-based resin can be used.

As above, the density of crystal defects in a side surface produced by etching is smaller than the density of crystal defects in a side surface produced by dicing. Because the photodiodes located in the end portions of the semiconductor substrates 2 and 2' do not need to be removed, a reduction in the number of photodiodes can be suppressed. Moreover, because the light receiving sections of the third semiconductor substrate 3 and the semiconductor substrates 2 and 2' have a constant pitch and are successive, combining these with a spectroscope allows obtaining a continuous spectrum.

Figure 15:
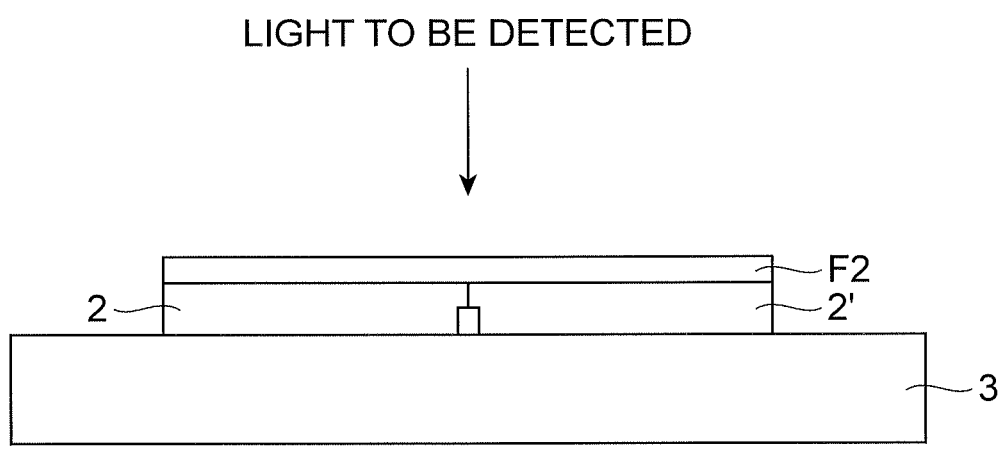
FIG. 15 is a view showing a spectroscopic instrument.

FIG. 15 is a view showing a spectroscopic instrument using the foregoing photodiode array module.

At a light incident surface side of the semiconductor substrate 2 having photodiodes having a 1.3 μm-band sensitivity and the semiconductor substrate 2' having photodiodes having a 2.3 μm-band sensitivity, a filter F2 that selectively transmits a specific wavelength band is provided. As the filter F2, a transmission wavelength variable filter (LVF: Linear Variable Filter) the transmission wavelength band of which changes linearly in the length direction can be used. A light to be detected is dispersed by the filter F2, and the dispersed light is detected by the respective photodiode arrays formed on the semiconductor substrates 2, 2', and output to the outside via the amplifiers formed on the semiconductor substrate 3. When the foregoing module is used, because a leak current to channels (pixels) in tip end portions is reduced, all interchannel gaps (distances) between the two chips can be equally spaced.

Also, the conductivity types in the foregoing respective semiconductor regions may be reversed. Moreover, in the first and second semiconductor substrates, for cathode extraction, contact holes are opened in the insulating layer formed on the cap layer, and contact electrodes are brought into direct contact with the cap layer, but in order to reduce contact resistance, a diffusion layer may be formed after opening contact holes, or the cap layer may be removed by etching to connect with the light absorbing layer by bumps. A diffusion layer may be formed to reduce contact resistance when connecting to the light absorbing layer, or etching may be performed up to the buffer layer or semiconductor substrate to cause a direct connection.

Moreover, for connections between the photodiode arrays formed on the first and second semiconductor substrates and amplifiers, the anodes of the photodiodes are connected to the inverting inputs (−) of the amplifiers, and the cathodes are connected to the non-inverting inputs (+) and common wirings CW2(1) and CW2(2) to take the form of differential amplifiers, but this is also a mere example. The common wirings CW2(1), CW2(2) and CW2'(1), CW2'(2) may be connected to an external power supply. Moreover, the photodiode arrays may take the form of single amplifiers, not differential amplifiers. There is an advantage that a bias voltage (a reverse bias voltage) can be applied to the photodiodes in the case of a single amplifier, and in the case of a differential amplifier, there is an advantage that the photodiodes can be with zero bias.

Moreover, the amplifiers serve as charge amplifiers each having a capacitance between the inverting input and output, but for resetting, a transistor is preferably provided as a reset switch in parallel with the capacitance. Moreover, outputs from the amplifiers are taken out from the terminals T, while a switch for determining whether or not to connect an output to the terminal T may be provided between the amplifier output and the terminal T.

REFERENCE SIGNS LIST

3 . . . third semiconductor substrate, 2 . . . first semiconductor substrate, 2' . . . second semiconductor substrate, PD2, PD2' . . . photodiode, P2, P2' . . . pixel region, STP, STP' . . . stepped portion, S1 . . . first side surface, S2 . . . second side surface, S1' . . . third side surface, S2' . . . fourth side surface.

The invention claimed is:

1. A photodiode array module comprising:
a first semiconductor substrate having a first photodiode array that is sensitive to light of a first wavelength band;
a second semiconductor substrate having a second photodiode array that is sensitive to light of a second wavelength band; and
a third semiconductor substrate which is formed with a plurality of amplifiers and on which the first and second semiconductor substrates are placed side by side without overlapping, wherein
the third semiconductor substrate has wirings respectively connected to the amplifiers,
each of the wirings is electrically connected to each photodiode of the first and second photodiode arrays via a bump,
in the first photodiode array, an end portion adjacent to the second photodiode array has a first stepped portion,
the first stepped portion has:
a first side surface and a second side surface along a thickness direction of the first semiconductor substrate; and
a first terrace surface located at a boundary between the first side surface and the second side surface and opposed to the third semiconductor substrate,
the first side surface is closer to the third semiconductor substrate than the second side surface,
a crystal defect density in the first side surface is lower than a crystal defect density in the second side surface,
in the second photodiode array, an end portion adjacent to the first photodiode array has a second stepped portion,
the second stepped portion has:
a third side surface and a fourth side surface along a thickness direction of the second semiconductor substrate; and
a second terrace surface located at a boundary between the third side surface and the fourth side surface and opposed to the third semiconductor substrate,
the third side surface is closer to the third semiconductor substrate than the fourth side surface, and
a crystal defect density in the third side surface is lower than a crystal defect density in the fourth side surface.

2. The photodiode array module according to claim 1, wherein
each of the photodiodes composing the first photodiode array includes:
a first semiconductor region of a first conductivity type; and
a first pixel region of a second conductivity type located at a surface layer side of a surface of the first semiconductor substrate opposed to the third semiconductor substrate,
a depth of the first terrace surface from an opposing surface of the first semiconductor substrate to the third semiconductor substrate is deeper than a depth of the first pixel region of the first photodiode array,
each of the photodiodes composing the second photodiode array includes:
a second semiconductor region of a first conductivity type; and
a second pixel region of a second conductivity type located at a surface layer side of a surface of the second semiconductor substrate opposed to the third semiconductor substrate, and
a depth of the second terrace surface from an opposing surface of the second semiconductor substrate to the third semiconductor substrate is deeper than a depth of the second pixel region of the second photodiode array.

3. A method of manufacturing a photodiode array module being a method of manufacturing the photodiode array module according to claim 1, comprising:
a step of preparing a first wafer including the first semiconductor substrate having the first photodiode array;
a step of etching the first wafer along a first etching line to expose the first side surface;

a step of dicing the first wafer along a deepest portion of the first etching line to expose the second side surface;
a step of preparing a second wafer including the second semiconductor substrate having the second photodiode array;
a step of etching the second wafer along a second etching line to expose the third side surface;
a step of dicing the second wafer along a deepest portion of the second etching line to expose the fourth side surface; and
a step of adhering the first semiconductor substrate and second semiconductor substrate to the third semiconductor substrate via the bumps, and electrically connecting each photodiode in the first semiconductor substrate and second semiconductor substrate to each of the amplifiers via the bump.

* * * * *